(12) United States Patent
Benschop

(10) Patent No.: US 7,960,972 B2
(45) Date of Patent: Jun. 14, 2011

(54) COIL ELEMENT SELECTION DEVICE FOR SELECTING ELEMENTS OF A RECEIVER COIL ARRAY OF A MAGNETIC RESONANCE IMAGING DEVICE

(75) Inventor: Franciscus Johanes Maria Benschop, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 74 days.

(21) Appl. No.: 12/443,899

(22) PCT Filed: Sep. 26, 2007

(86) PCT No.: PCT/IB2007/053898
§ 371 (c)(1),
(2), (4) Date: Apr. 1, 2009

(87) PCT Pub. No.: WO2008/041155
PCT Pub. Date: Apr. 10, 2008

(65) Prior Publication Data
US 2009/0302839 A1    Dec. 10, 2009

(30) Foreign Application Priority Data
Oct. 3, 2006  (EP) .................. 06121671

(51) Int. Cl.
*G01V 3/00*    (2006.01)
(52) U.S. Cl. ...................... 324/309; 324/307

(58) Field of Classification Search .............. 324/309, 324/307
See application file for complete search history.

(56) References Cited

U.S. PATENT DOCUMENTS

| | | | |
|---|---|---|---|
| 6,223,065 B1 | 4/2001 | Misic et al. | |
| 6,961,455 B2 * | 11/2005 | Ma et al. | 382/131 |
| 7,218,109 B2 * | 5/2007 | Campagna | 324/309 |
| 7,259,559 B2 * | 8/2007 | Nabetani et al. | 324/309 |
| 7,279,893 B1 * | 10/2007 | Marinelli et al. | 324/307 |
| 2004/0165757 A1 | 8/2004 | Ma et al. | |
| 2005/0083051 A1 | 4/2005 | Campagna et al. | |
| 2005/0275402 A1 | 12/2005 | Campagna et al. | |

FOREIGN PATENT DOCUMENTS

| | | |
|---|---|---|
| EP | 1249708 A1 | 10/2002 |
| EP | 1319957 A1 | 6/2003 |
| WO | 04001435 A1 | 12/2003 |
| WO | 2005010544 A1 | 2/2005 |

* cited by examiner

*Primary Examiner* — Louis M Arana

(57) ABSTRACT

The present invention provides a sensor selection device for selecting sensor elements of a magnetic resonance imaging device, the sensor selection device comprising a provider for providing a first characteristic property (601) of a first sensor element (603) within a predetermined scan volume and for providing a second characteristic property (605) of a second sensor element (607) within the predetermined scan volume (215), a means for determining a mutual quantity from the first characteristic property (601) and from the second characteristic property (605), and a selector for selecting or for excluding the first sensor element (601) or the second sensor element (601) based on the mutual quantity.

6 Claims, 8 Drawing Sheets

COIL ELEMENT SELECTION DEVICE FOR SELECTING ELEMENTS OF A RECEIVER COIL ARRAY OF A MAGNETIC RESONANCE IMAGING DEVICE

FIELD OF THE INVENTION

The present invention is directed to the field of magnetic resonance imaging devices comprising sensor elements for acquiring magnetic resonance signals.

Magnetic resonance imaging devices may acquire imaging data using parallel imaging with an increasing number of sensor elements, e.g. coil elements and data acquisition channels. In the early 90's, usually only one channel output was used. In the mid-nineties, multi-channel-acquisition was introduced, so that, at present, 16, 32 or 90 channel acquisitions are achievable.

In the recent past, typically four or six channels were employed, so that an operator of a magnetic resonance imaging (MRI) system could make a selection of sensor elements used for scanning manually. However, when using MRI systems with over 50 sensor elements (e.g. coil elements) connected with each other, wherein about 30 sensor elements are arranged within the field of view at the same time, the selection has to be automated in order to reduce the workflow complexity for the users of the MRI scanners.

The selection of sensor elements is necessary in order to avoid using elements with e.g. very low signal to noise ratios (SNR) which can degrade the SNR of the final images or to avoid using elements being arranged outside the homogeneous sphere which can pronounce artifacts in the images. The selection is further important with respect to the reconstruction resources (CPU and Memory) or the bulk data channel bandwidth.

Location dependent selection approaches are based on the location of coils in relation to a location of the scan volume, so that the elements being arranged close to the scan volume are selected. The selection may be performed either automatically or by the operator operating the magnetic resonance device. In case of the operators selection, the operator determines e.g. upon considering the patient and coil which element should be used. In case of the automatic selection, the elements being close to the scan volume are selected. The disadvantage of the coil location-based selection approach is that the coil positions must be known or must be measured. Manual selection might be impaired by selection errors due to mispositioning of coils and may result in a long adjustment period.

Furthermore, the elements can be selected based upon the SNR as e.g. described in ISMRM 2006, Automatic Coil Element Selection for Parallel Imaging of localized Regions, M. Bruehrer et al. SNR-based selection schemes may fail in e.g. low proton density areas. Automatic coil selection is e.g. described in EP 1 249 708 A1.

SUMMARY OF THE INVENTION

It is the object of the invention to provide an efficient concept for automatically selecting sensor elements of a magnetic imaging resonance device.

This object is achieved by the features of the independent claims.

The present invention is based on the finding that an efficient selection of sensor elements can be achieved when exploiting the sensitivity profiles of the sensor elements in the region of interest. The sensitivity profiles may further comprise a spatial sensitivity distribution, e.g. a 3D sensitivity distribution.

The coil sensitivity is substantially independent from e.g. proton density distributions in a subject under analysis. In the lungs, for example, the detectable signal is low with respect to the liver. However, the coil sensitivities can be equal. In this context, the sensitivities of individual sensors can be obtained from:

$$C(x,y,z)_{element} = S(x,y,z)_{element} / S(x,y,z)_{QBC}.$$

Where $C(x,y,z)_{element}$ indicates the coil element sensitivity at position (x,y,z). $S(x,y,z)_{element}$ indicates the signal (intensity and phase) measured by a coil element and $S(x,y,z)_{QBC}$ indicates the signal (intensity and phase) measured by a large volume coil having a homogenous sensitivity distribution.

Thus, the physical arrangement of the sensor elements with respect to the region of interest does not provide an efficient selection criterion.

The present invention provides a sensor selection device for selecting sensor elements of a magnetic resonance imaging device which may comprise e.g. a plurality of sensor elements to be used for scanning. Preferably, the sensor selection device comprises a provider for providing a first characteristic property of a first sensor element within a predetermined scan volume or scan area (i.e. within a region of interest) and for providing a second characteristic property of a second sensor element within the predetermined scan volume. The sensor elements may be e.g. receiver antenna elements or coils which may be selected from a larger set of available receiver elements for e.g. a parallel imaging. Furthermore, the sensor detection device may comprise a means for determining a mutual quantity from the first characteristic property and from the second characteristic property. Furthermore, a selector for selecting or for excluding the first sensor element or the second sensor element based on the mutual quantity is provided. According to an aspect, a plurality of sensors can be selected.

According to an aspect, the first characteristic property is a sensitivity profile of the first sensor element within the predetermined scanned area. Correspondingly, the second characteristic property is a sensitivity profile of the second sensor element within the predetermined scanned area.

According to an aspect, the selector may further be configured to pre-select the first sensor element from a plurality of sensor elements on a basis of the first characteristic property and to pre-select the second sensor element from a plurality of sensor elements on a basis of the second characteristic property. For example, the plurality of sensor elements is arranged to cover a scan volume of a magnetic resonance imaging device, wherein only a certain region of the scan volume is he region of interest. The selector may first pre-select the possible sensor elements first by e.g. comparing the magnitude of the sensitivity or a magnitude of an integrated sensitivity profiles to a predetermined threshold which may be equal to 5% the maximum sensitivity within the predetermined scan volume. Thus, the selector pre-selects those sensor elements having sensitivity profiles extending within the region of interest and having magnitudes above the threshold and excludes those sensor elements having sensitivity profiles with magnitudes below the threshold within the region of interest. The further selection on the basis of the mutual quantity is therefore based on the pre-selected sensor elements.

According to the invention, the e.g. spatially resolved sensitivity information may be used in one or more of the following ways:

Full coverage of scan volume by e.g. coil sensitivities;

Optimized to a homogeneous coverage of scan volume;

SENSE-optimized: Make sure that in the one or two SENSE-directions of the scan, the sensitivities are sufficiently independent, in order to achieve a good SENSE unfolding.

One two or three of those measures can be used and or combined in some weighted criterion.

The SENSE-optimized goal can be achieved by attempting to select elements with independent coil sensitivities in three dimensions, at the cost of for example absolute sensitivities. A second approach is only looking at the one or two SENSE directions and projecting the sensitivities on those SENSE directions, after which the level of dependence of the projections of the different coil elements can be evaluated. Both approaches can be handled by the inner product algorithm. The included pictures more or less apply best to the SENSE-directional (1D) approach, but generalization to 3D can easily be made.

The mutual quantity may indicate "a measure of independence of the (spatially resolved) sensitivity distributions". A measure of independence of the spatially distributed sensitivity functions is the absolute value of the inner product, which is zero for totally independent (e.g. orthogonal) distributions. A more general measure of independence of distribution is the mutual information criterion. In the following, the inner product approach is, by way of example only, considered as e.g. an algorithm to demonstrate SENSE optimized selection.

The mutual quantity may indicate the independence between the first and the second characteristic property within a predetermined independence range. For example, if the first and the second characteristic properties are independent with respect to each other then the mutual quantity determined by e.g. the inner product may be equal to 0. On the other hand, if the first and second characteristic property are dependent then the mutual quantity determined by e.g. the inner product may be equal to 1, or vice versa. For example, the selector selects the first or the second element if the mutual quantity is within the predetermined independence range determined by e.g. the inner product extending from e.g. 0 to 0.4 and excludes the first or the second sensor element if the mutual quantity is outside the predetermined independence range. The above-mentioned numbers (except for inner product equal to zero) apply to normalized coil sensitivities.

According to an aspect, the means for determining the mutual value determines an inner product of the first and the second characteristic property to obtain the mutual quantity representing the inner product between the first and the second characteristic property.

According to an aspect, the selector may first pre-select a number of selecting sensor elements from a plurality of sensor elements, the number being greater than or equal to 2. In this case, the means for determining may determine the plurality of mutual quantities by e.g. determining inner products or other independency criterion, e.g. mutual information, between different sensitivity profiles with each other. Thus, the selector may select and/or exclude a plurality of sensor elements based on the mutual quantities by e.g. comparing each mutual quantity with the predetermined independency range.

According to another aspect, the invention provides a magnetic resonance imaging device comprising a plurality of sensing elements being arranged to form a scan volume and the sensor selection device according to the present invention. The sensor selection device selects a first and a second sensor element from the plurality of sensor elements, the first and/or the second sensor element to be used for scanning within a predetermined scan volume (i.e. the region of interest) of the scan volume. Thus, the magnetic resonance imaging device may, after the selection of the sensor elements has been performed, perform e.g. a coarse or a fine resolution scan using the sensor elements being selected on the basis of the mutual quantity.

The present invention further provides a method for selecting sensor elements of a magnetic resonance imaging device with the step of providing a first characteristic property of a first sensor element within a predetermined scan volume and providing a second characteristic property of a second sensor element within the predetermined scanned area. The method further comprises determining a mutual quantity from the first characteristic property and the second characteristic property and selecting and/or excluding the first sensor element and/or the second sensor element based on the mutual quantity. Further steps of the inventive method correspond to the functionality of the inventive sensor selection device.

The invention further provides a method for operating a magnetic resonance imaging device which comprises a plurality of sensor elements being arranged to form a scan volume. The method comprises selecting a first sensor element and/or a second sensor element from the plurality of sensor elements according to the inventive method for selecting sensor elements of a magnetic resonance imaging device. The method may further comprise performing a scan within the region of interest using the selected sensor element.

The invention further provides a computer program for performing the method for selecting sensor elements of a magnetic resonance imaging device and/or for operating a magnetic resonance imaging device when the computer program runs on a computer.

According to the invention, the selection of the sensor elements (receiver elements) actually employed to acquire magnetic resonance signals is made on the basis of the (receiver) sensitivity profiles. Notably, a set of receiver elements is chosen that has a maximum sensitivity; wherein the sensitivity profiles of the receiver elements are sufficiently independent. The selection may further be made automatically on the basis of a coarse resolution scan.

The inventive concept has the advantage that a noise break through is avoided when some parallel imaging techniques are applied, or that dark spots are avoided when other reconstruction techniques, for example noise scaling, are applied. Furthermore, the selection of the sensor elements is made independently of e.g. a signal strength which may result due to a low proton density. Further, having the entire volume of interest (covered by e.g. a minimum number) of receiver element sensitivities will avoid the noise breakthrough due to the parallel imaging. In addition, orthogonal receiver sensitivity profiles for many receiver elements contribute to avoiding artifacts in the parallel imaging approach. Thus, the workflow is efficient and the image quality is improved.

The selection criterion may be e.g. a homogeneous coverage, artifact suppression, a maximum coil sensitivity in a volume of interest and/or a full spatial coverage of the volume of interest. The volume of interest (predetermined scan volume) may be the scan volume or it can form the whole homogeneous sphere. The sensitivity profiles, e.g. coil sensitivities, can be measured or derived from a model fitted to measurements or calculated using theoretical sensitivity profiles.

According to another aspect, a quick pre-selection can be performed. For example, the coil sensitivities per sensor element may be integrated over the region of interest (e.g. scan volume), so that the integrated sensitivities can be used to perform a quick pre-selection. For example, those elements with low sensitivities (e.g. close to zero) are likely to be outside the field of view and can therefore be excluded. For example, a low sensitivity results when its integrated value is below e.g. 10% of a maximum integrated value obtained e.g. from the integrations over a scan volume. Furthermore, volume selective integrated sensitivities (e.g. coil sensitivities) can be obtained during a brief preparation phase making e.g. single dimensional projections on three independent axes.

The optimal selection may be e.g. performed in dependency on different applications which may require different criteria. For example, in the case of a (normal) reconstruction, a spatially homogeneous distribution of sensitivities may be of interest. For SENSE or CLEAR techniques, sufficiently independent element sensitivity distributions in the required SENSE directions may be chosen, so that at least all of the regions of interest are covered by e.g. a minimum level of sensitivities to avoid noise break through. For artifact suppression, the elements being arranged within the (flame) artifact producing regions may be suppressed. Or elements especially sensitive to flow or motion artifact producing regions, such as the fat tissue in the belly, within or outside the scan volume may be suppressed.

The inventive SENSE-optimized element selection is based on an actual distribution of e.g. coil sensitivities, wherein an optimal sense unfolding in e.g. an unforeseen use of coils (for example rotated placement) may be achieved. Furthermore the knowledge of the geometrical arrangement of the sensor elements (e.g. coils) is not necessary. In addition, the SENSE properties of the sensor elements can easily be determined. Thus, the sensor sensitivities in the region of interest provide a good measure, since the sensitivity profiles describe how good the sensor elements "see" the area of interest. Since the user is taken out of the loop, the image quality is improved.

BRIEF DESCRIPTION OF THE DRAWINGS

Further embodiments of the present invention will be described with respect to the following figures, in which.

DETAILED DESCRIPTION OF THE INVENTION

Figure 1:
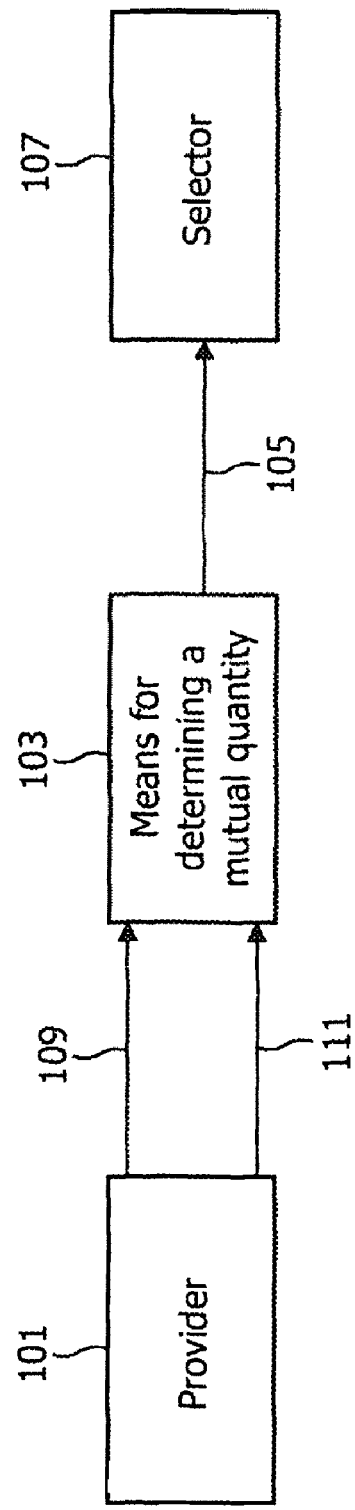
FIG. 1 shows a block diagram of a sensor selection device.

FIG. 1 shows a block diagram of the sensor selection device comprising a provider 101, a means 103 for determining a mutual quantity 105 and a selector 107. The provider provides a first characteristic property 109 of a first sensor (not shown in FIG. 1) and a second characteristic property 111 of a second sensor (not shown in FIG. 1).

Figure 2:
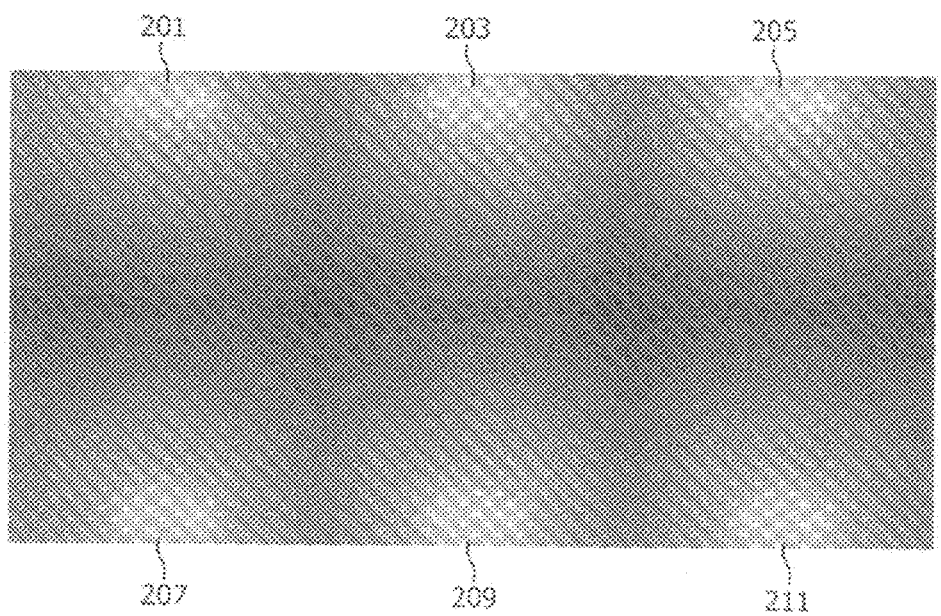
FIG. 2 shows a calculated coil sensitivity map of two arrays of three elements.

FIG. 2 shows a calculated coil sensitivity map of two arrays of three elements. A first array comprises the elements 201, 203 and 205. The second array comprises the elements 207, 209 and 211.

Figure 3:
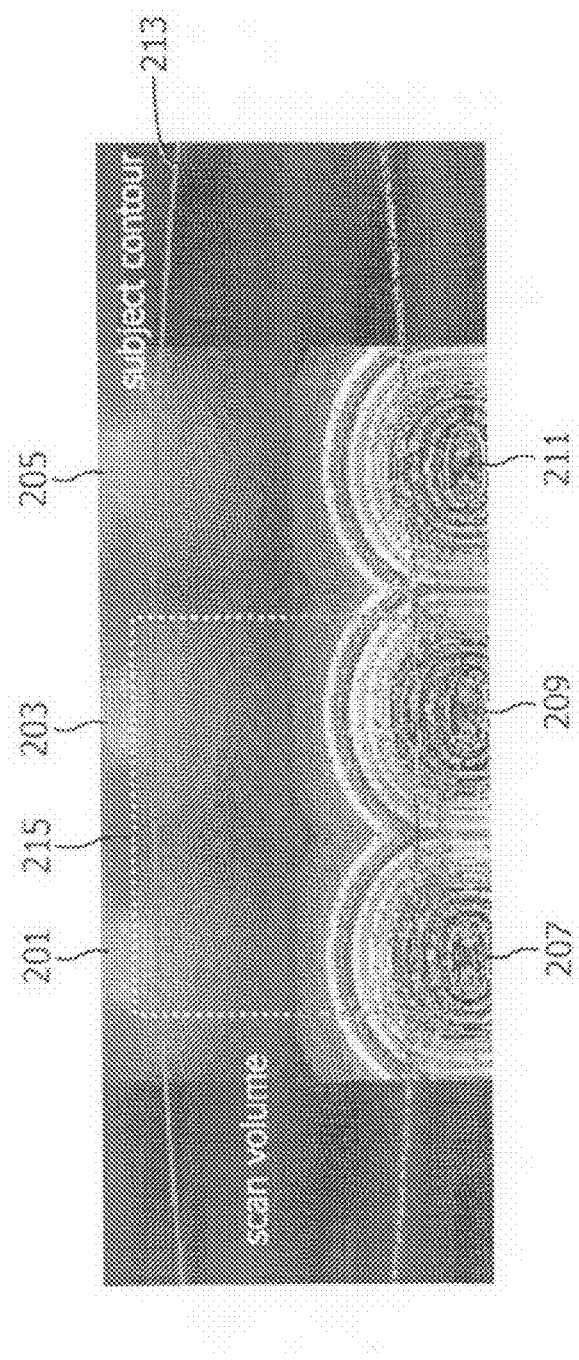
FIG. 3 shows a subject contour and a scan volume.

FIG. 3 shows a contour 213 of a subject to be scanned (e.g. a patient) and a scan volume 215 (region of interest, predetermined scan volume). For example, the elements 207 and 209 which are arranged outside the scan volume 215 may be used for sensing, since their sensitivity extends within the scan volume.

Figure 4:
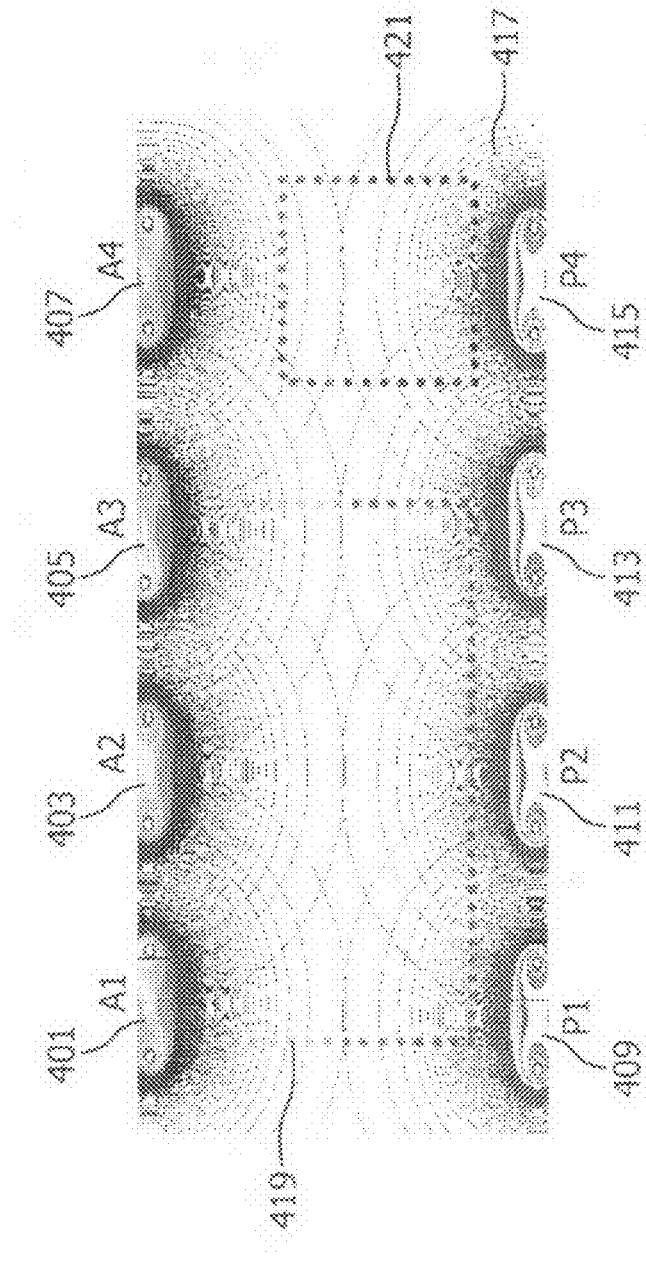
FIG. 4 shows the region of interest based element selection.

FIG. 4 demonstrates the inventive region of interest based sensor element selection. In this embodiment, the magnetic resonance imaging device may comprise the sensor elements 401 (A1), 403 (A2), 405 (A3), 407 (A4), 409 (P1), 411 (P2), 413 (P3) and 415 (P4). In FIG. 4, the sensitivity profiles of the sensor elements are depicted by the sensitivity profile lines 417. In order to select the sensor element to be used for scanning within a first region of interest 419, e.g. the sensor elements A1, A2, A3, P1, P2 and P3 may be selected. For scanning within a second region of interest 421, e.g. the sensor elements P4, A4 and P3 may be selected. The selection may be performed by the inventive selector. Furthermore, the sensor elements may be formed by coils as depicted in FIG. 4.

Figure 5:
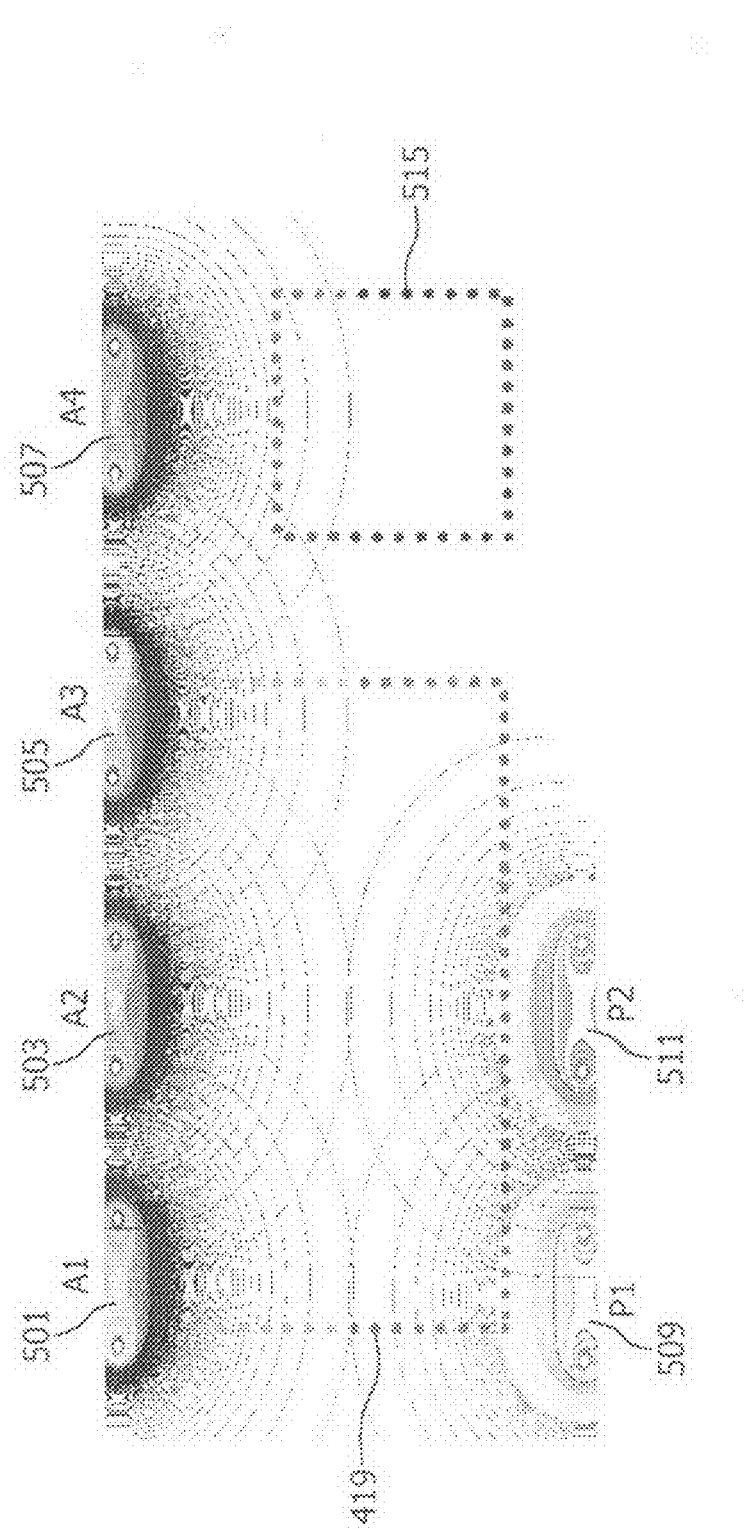
FIG. 5 shows the region of interest based element selection.

FIG. 5 demonstrates a region of interest based sensor element selection approach for a magnetic resonance imaging device comprising sensor elements 501 (A1), 503 (A2), 505 (A3), 507 (A4), 509 (P1) and 511 (P2) which are arranged as shown in FIG. 5. In order to scan within a first region of interest 513, the selector may select the sensor elements A1, A2, A3, P1 and P2 based on the sensitivity profiles depicted in FIG. 5. However, a second region of interest 515 may be in this embodiment only insufficiently covered, since substantially only the sensor element 507 has a sensitivity profile extending within the second region of interest 515. In this case, a signal may be issued by e.g. the inventive sensor selection device indicating that the second region of interest 515 is insufficiently covered. This signal may be issued after the selector has excluded the sensor elements 501, 503, 505, 509 and 511 from being used during the scan operation.

Figure 6:
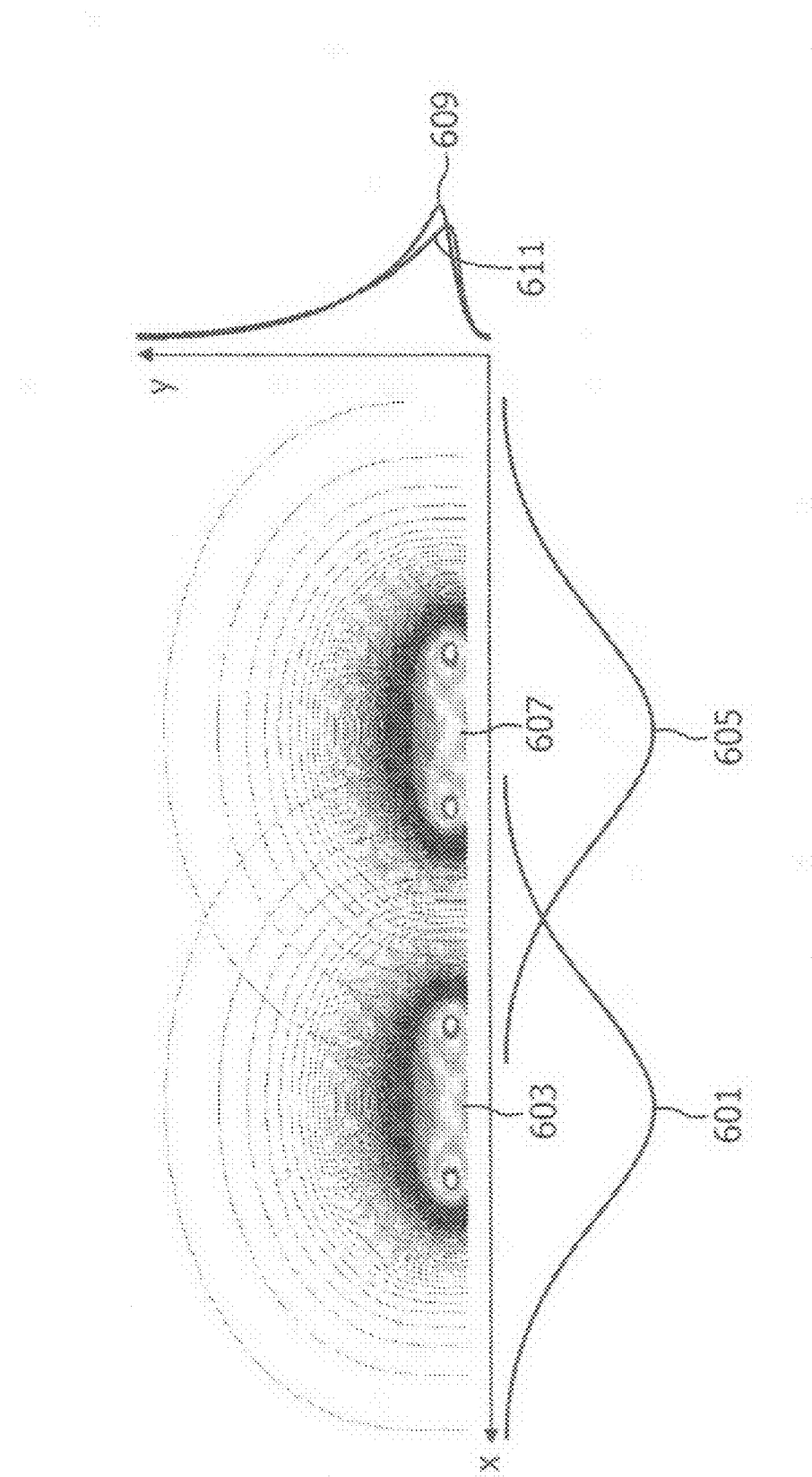
FIG. 6 shows coil sensitivities of two elements projected on an x-and y-axis.

FIG. 6 demonstrates sensitivity profiles of two sensor elements projected on an x-and a y-axis. A sensitivity profile 601 of a first sensor element 603 and a sensitivity profile 605 of a sensor element 607 with respect to the x-axis have different maxima so that a sense factor which is equal to 2 in the x-direction can be achieved. With respect to the y-axis, a sensitivity profile 609 of the first sensor element 603 and a sensitivity profile 611 of the sensor element 607 have maxima which are distributed along the y-axis in a similar manner so that in y-direction a sense factor of at most 1 is likely to be achieved.

As depicted in FIG. 6, the sensitivity profiles 601 and 605 only partially overlap with respect to the x-direction. On the other hand, the overlap of the sensitivity profiles 609 and 611 with respect to the y-direction is significant. A measure of overlap or independency of the sensitivity profiles may be the inner product of the sensitivity profiles. In this respect, the inner product of two functions is zero when they are fully independent (e.g. orthogonal). Consequently, when the sensitivity profiles are fully independent then they do not overlap. The inner product of two functions f, g, may be determined with respect to the variable x as follows:

$$\langle f,g \rangle = \int f^*(x)g(x)dx,$$

wherein f, g are functions of the variable x.

The inner product of a volume composed of voxels is the dot product of two vectors:

$$\langle (x_1, \ldots, x_n), (y_1, \ldots, y_n) \rangle := \sum_{i=1}^{n} x_i y_i = x_1 y_1 + \ldots + x_n y_n$$

In the above formula, $x_i$ and $y_i$ denote the values of the voxels, for example the sensitivities of two coil elements x and y and n denote and index over all voxels.

Figure 7:
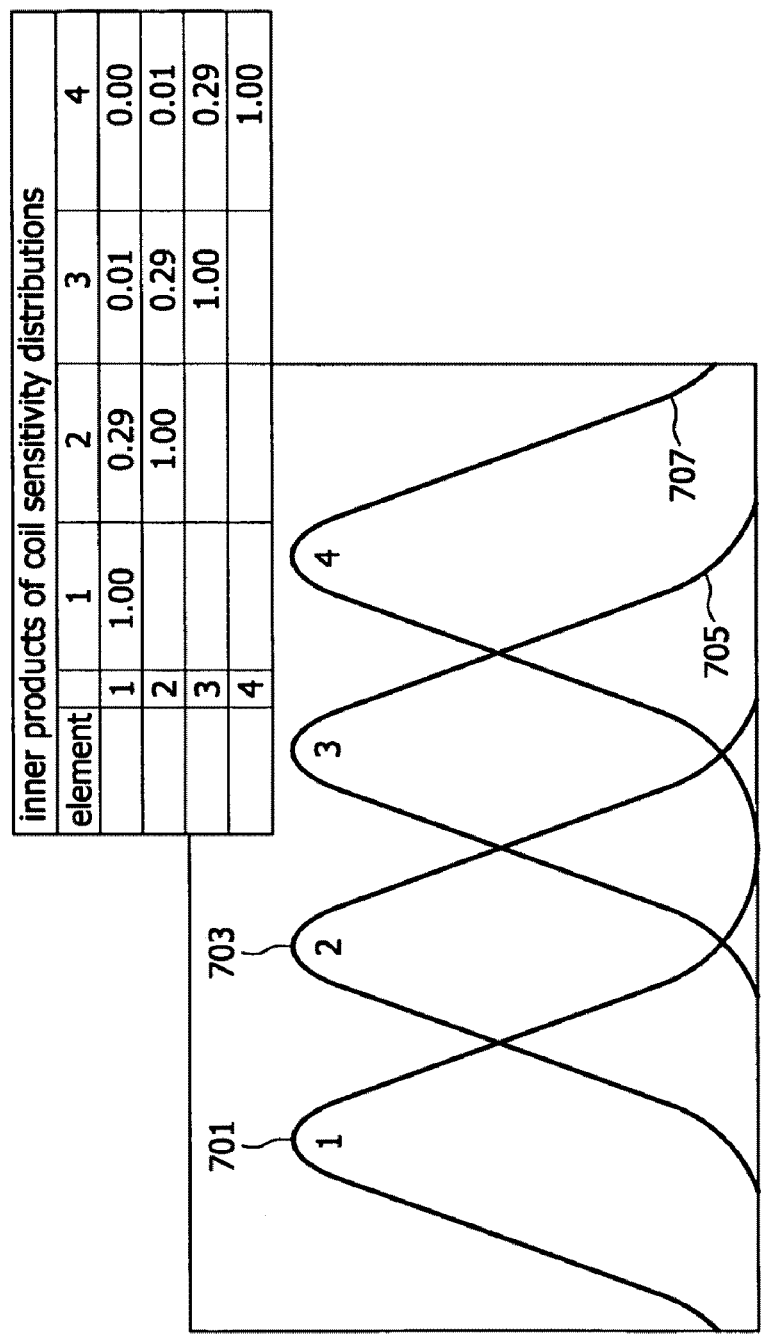
FIG. 7 shows an extend of overlap of coil sensitivity distributions.

FIG. 7 demonstrates the extent of overlap of coil sensitivity distributions and the inner products of the coil sensitivity distributions. In particular, a sensitivity distribution 701 of a first coil element, a sensitivity distribution 703 of a second coil element, a sensitivity distribution 705 of a third coil element and a sensitivity distribution 707 of a fourth coil element are depicted in an overlapping manner. The inner products of the coil sensitivity distributions for the coil elements 1, 2, 3 and 4 are depicted in form of a matrix in FIG. 7. The respective inner product between coil sensitivity distributions of different coil elements is less than 1 which indicates a degree of a dependency between the sensitivity distributions. On the other hand, the inner product of a coil sensitivity distribution with itself is always equal to 1 which characterizes a perfectly dependent distribution. The absolute numbers of inner products apply to normalized vectors.

Figure 8:
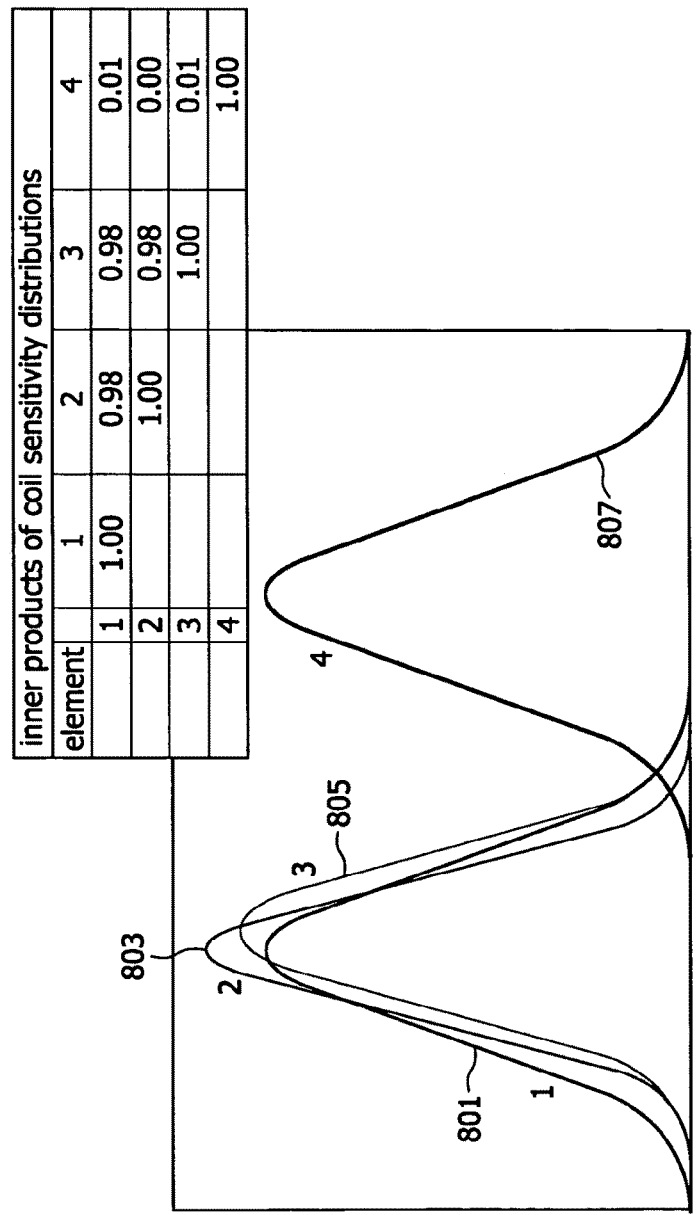
FIG. 8 shows an extend of overlap of coil sensitivity distributions.

FIG. 8 shows the extent of overlap of coil sensitivity distributions according to another embodiment. In particular, a sensitivity distribution 801 of a first sensor element, a sensitivity distribution 803 of a second sensor element and a sensitivity distribution 805 of a third sensor element almost coincide with each other. A sensitivity distribution 807 of a fourth sensor element is, however, significantly shifted with respect to the sensitivity distributions 801, 803 and 805. As depicted in the table summarizing the inner products of the coil sensitivity distributions for the sensor elements 1, 2, 3 and 4, the sensitivity distributions 801, 803 and 805 are almost fully dependent with respect to each other, since the inner products are equal to 0.98. On the contrary, the inner product between the sensitivity distribution 807 and any of the sensitivity distributions 801 to 805 is equal to or less than 0.01. Thus, the sensitivity distribution 807 may be considered as being almost independent with respect to the sensitivity distributions 801, 803 and 805 within a predetermined independence range which may extend, e.g. in terms of an inner product, between 0 and 0.1. Furthermore, the selection may depend on the actual distributions and their inner products. For example, the most overlapping elements are left out, wherein e.g. the least overlapping elements are used.

With respect to FIG. 6, the inner products of the sensitivities 601 and 605 are almost zero, so that sense unfolding is possible. On the contrary, the inner product between the sensitivities 609 and 611 along the x-axis is almost 1, so that sense unfolding is not possible.

Usually, the selection of the sensor elements is done before a scan starts. Moreover, the inventive approach can also be performed in retrospect in reconstruction to perform e.g. a data reduction. Moreover, the image quality is improved since the user is not involved in the selection process anymore.

Moreover, the spatially distributed coil sensitivity is data based or based on actually measured data in the subject (patient). Thus, the coil sensitivities in the region of interest provide a good measure for the selection process, since they describe how good the sensor elements "see" the area of interest. Moreover, the inventive approach so passes coil location based selection as those mechanisms are approximations of how good the region of interest may be seen by the sensor elements. Moreover, the inventive approach does not suffer from the disadvantage of a signal based selection strategy in e.g. low proton density areas. Furthermore, the sensitivity profiles may be measured, predefined or calculated (or any combination thereof, for example a model fitted to measured data).

Furthermore, the inventive concept provides a possibility for application-dependent optimizations since e.g. in optimal image quality can be obtained due to an optimal sense unfolding. Furthermore artefact suppression can be performed, for example by not-selecting an element in the flame artefact regions. In addition, homogeneous coil sensitivities can be used for non-SENSE/CLEAR reconstructions.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A magnetic resonance imaging device for selecting sensor elements comprising a sensor selection device with
    a provider for providing a first characteristic property of a first sensor element within a predetermined scan volume and for providing a second characteristic property of a second sensor element within the predetermined scan volume;
    a means for determining a mutual quantity from the first characteristic property and from the second characteristic property; and
    a selector for selecting or for excluding the first sensor element or the second sensor element based on the mutual quantity the first characteristic property being a sensitivity profile or an integrated sensitivity profile of the first sensor element within the predetermined scan volume, the second characteristic property being a sensitivity profile or an integrated sensitivity profile of the second sensor element within the predetermined scan volume, the mutual quantity indicating a level of independency between the first characteristic property and the second characteristic property, and wherein the means for determining the mutual quantity is configured to determine an inner product the first characteristic property and the second characteristic property in order to obtain the mutual quantity.

2. The magnetic resonance imaging device according to claim 1, the selector being further configured to pre-select the first sensor element from a plurality of sensor elements on a basis of the first characteristic property and to pre-select the second sensor element from a plurality of sensor elements on a basis of the second characteristic property.

3. The magnetic resonance imaging device according to claim 1, the selector being configured to select the first sensor element or the second sensor element if the mutual quality is within a predetermined independencyrange or to exclude the first or the second sensor element if the mutual quality is outside the predetermined range.

4. The magnetic resonance imaging device according to claim 1, wherein the scan volume is covered by at least a partial sensitivity or wherein the scan volume is at least partly homogeneously covered by sensitivities.

5. A magnetic resonance imaging device, comprising:
   a plurality of sensor elements being arranged to form a scan volume; and
   the sensor selection device according to claim 1 for selecting a first sensor element or a second element from the plurality of sensor elements, the first sensor element or the second sensor element to be used for scanning within a predetermined scan volume of the scan volume.

6. A method for selecting sensor elements of a magnetic resonance imaging device, the method comprising:
   providing a first characteristic property of a first sensor element within a predetermined scan volume and for providing a second characteristic property of a second sensor element within the predetermined scan volume;
   determining a mutual quantity from the first characteristic property and from the second characteristic property; and
   selecting or excluding the first sensor element or the second sensor element based on the mutual quantity,
   the first characteristic property being a sensitivity profile or an integrated sensitivity profile of the first sensor element within the predetermined scan volume, the second characteristic property being a sensitivity profile or an integrated sensitivity profile of the second sensor element within the predetermined scan volume, the mutual quantity indicating a level of independency between the first characteristic property and the second characteristic property, and wherein the step of determining the mutual quantity is configured to determine an inner product the first characteristic property and the second characteristic property in order to obtain the mutual quantity.

* * * * *